(12) United States Patent
Chiang et al.

(10) Patent No.: US 10,049,973 B2
(45) Date of Patent: Aug. 14, 2018

(54) ELECTRONIC PACKAGE AND FABRICATION METHOD THEREOF AND SUBSTRATE STRUCTURE

(71) Applicant: Siliconware Precision Industries Co., Ltd., Taichung (TW)

(72) Inventors: Ching-Wen Chiang, Taichung (TW); Kuang-Hsin Chen, Taichung (TW); Hsien-Wen Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 254 days.

(21) Appl. No.: 14/984,256

(22) Filed: Dec. 30, 2015

(65) Prior Publication Data

US 2016/0276256 A1     Sep. 22, 2016

(30) Foreign Application Priority Data

Mar. 17, 2015   (TW) ............................. 104108424 A

(51) Int. Cl.
| | |
|---|---|
| H01L 21/48 | (2006.01) |
| H01L 23/498 | (2006.01) |
| H01L 23/538 | (2006.01) |
| H01L 21/683 | (2006.01) |
| H01L 21/56 | (2006.01) |
| H01L 23/31 | (2006.01) |

(52) U.S. Cl.
CPC ...... *H01L 23/49827* (2013.01); *H01L 21/486* (2013.01); *H01L 21/6835* (2013.01); *H01L 21/6836* (2013.01); *H01L 23/5384* (2013.01); *H01L 21/568* (2013.01); *H01L 23/3128* (2013.01); *H01L 23/49811* (2013.01); *H01L 23/5389* (2013.01); *H01L 2221/68331* (2013.01); *H01L 2224/16235* (2013.01); *H01L 2224/16238* (2013.01); *H01L 2224/81005* (2013.01); *H01L 2924/15311* (2013.01)

(58) Field of Classification Search
None
See application file for complete search history.

(56) References Cited

U.S. PATENT DOCUMENTS

| | | | | |
|---|---|---|---|---|
| 2011/0316147 A1* | 12/2011 | Shih | ...................... | H01L 21/486 257/737 |
| 2014/0084480 A1* | 3/2014 | Wang | ................ | H01L 23/49827 257/774 |

(Continued)

*Primary Examiner* — Daniel Whalen
(74) *Attorney, Agent, or Firm* — Mintz Levin Cohn Ferris Glovsky and Popeo, P.C.; Peter F. Corless; Steven M. Jensen

(57) ABSTRACT

A substrate structure is provided, which includes: a substrate body having opposite first and second surfaces; a plurality of conductive posts formed on the first surface of the substrate body and electrically connected to the substrate body; and a dielectric layer formed on the first surface of the substrate body for encapsulating the conductive posts, wherein one end surfaces of the conductive posts are exposed from the dielectric layer. Therefore, the present invention replaces the conventional silicon substrate with the dielectric layer so as to eliminate the need to fabricate the conventional TSVs (Through Silicon Vias) and thereby greatly reduce the fabrication cost. The present invention further provides an electronic package having the substrate structure and a fabrication method thereof.

10 Claims, 6 Drawing Sheets

(56) References Cited

U.S. PATENT DOCUMENTS

2016/0073516 A1\* 3/2016 Chou .................... H01L 23/498
                                                                                              174/251
2016/0086893 A1\* 3/2016 Wu ....................... H01L 23/562
                                                                                              257/669

\* cited by examiner

ELECTRONIC PACKAGE AND FABRICATION METHOD THEREOF AND SUBSTRATE STRUCTURE

CROSS-REFERENCES TO RELATED APPLICATIONS

This application claims under 35 U.S.C. § 119(a) the benefit of Taiwanese Application No. 104108424, filed Mar. 17, 2015, the entire contents of which are incorporated herein by reference.

BACKGROUND OF THE INVENTION

1. Field of the Invention

The present invention relates to electronic packages, and more particularly, to an electronic package, a fabrication method thereof and a substrate structure for saving the fabrication cost.

2. Description of Related Art

Along with the rapid development of electronic industries, electronic products are developed toward the trend of multi-function and high performance. Accordingly, there have been developed various types of flip-chip packaging modules such as chip scale packages (CSPs), direct chip attached (DCA) packages and multi-chip modules (MCM), and 3D IC chip stacking technologies.

FIGS. 1A to 1F are schematic cross-sectional views showing a method for fabricating a 3D chip stacking-type electronic package 1 according to the prior art.

Referring to FIG. 1A, a silicon substrate 10 having a chip mounting side 10a and an opposite external connection side 10b is provided, and a plurality of via holes 100 are formed on the chip mounting side 10a of the silicon substrate 10.

Referring to FIG. 1B, an insulating material 102 and a conductive material such as copper are filled in the via holes 100 to form a plurality of through silicon vias (TSVs) 101. Then an RDL (Redistribution Layer) structure is formed on the chip mounting side 10a of the silicon substrate 10 and electrically connected to the TSVs 101.

In particular, to form the RDL structure, a dielectric layer 11 is first formed on the chip mounting side 10a of the silicon substrate 10. Then, a circuit layer 12 is formed on the dielectric layer 11 and has a plurality of conductive vias 120 formed in the dielectric layer 11 and electrically connected to the TSVs 101. Thereafter, an insulating layer 13 is formed on the dielectric layer 11 and the circuit layer 12, and portions of the circuit layer 12 are exposed form the insulating layer 13. Finally, a plurality of first conductive elements 14 such as solder bumps are formed on the exposed portions of the circuit layer 12.

Referring to FIG. 1C, a temporary carrier 40 (for example, a glass carrier) is attached to the insulating layer 13 through an adhesive 400. Then, the silicon substrate 10 is partially removed by grinding the external connection side 10b of the silicon substrate 10, thus forming an external connection side 10b' exposing one end surfaces of the TSVs 101.

In particular, before the grinding process, the thickness h of the silicon substrate 10 (shown in FIG. 1B) is between 700 and 750 um. After the grinding process, the thickness h' of the silicon substrate 10 (shown in FIG. 1C) is 100 um. Generally, the silicon substrate 10 is mechanically ground to a thickness of 102 to 105 um first and then ground by CMP (Chemical Mechanical Polishing) to 100 um.

The thickness t of the adhesive 400 is 50 um and limited by the total thickness variation (TTV) of the adhesive 400. Referring to FIG. 1C', if the total thickness variation of the adhesive 400 is too large (about 10 um), the silicon substrate 10 tilts to one side. As such, the silicon substrate 10 easily cracks during the grinding process. Further, after the grinding process, only a portion of the TSVs 101 are exposed.

Furthermore, limited by the thickness h' of the silicon substrate 10, the TSVs 101 are required to have a certain depth d (about 100 um). Therefore, the depth to width ratio of the TSVs 101 is limited to 100 um/10 um. That is, the depth d of the TSVs 101 is 100 um and the width w of the TSVs 101 is 10 um.

In addition, the TSVs 101 having a depth of only 10 um cannot be mass produced due to a high fabrication cost. In particular, since the total thickness variation of the adhesive 400 is about 10 um, the silicon substrate 10 can only be ground (including mechanical grinding and CMP) to a thickness h' of 100 um. Subsequently, a wet etching process is required to remove the silicon substrate 10 by a thickness h" of 90 um so as to expose the TSVs 101. However, the wet etching process is time-consuming and needs a large amount of etching solution, thus increasing the fabrication cost.

Referring to FIG. 1D, an insulating layer 15 is formed on the external connection side 10b' of the silicon substrate 10 and the end surfaces of the TSVs 101 are exposed from the insulating layer 15. Then, a plurality of second conductive elements 16 are formed on and electrically connected to the end surfaces of the TSVs 101. The second conductive elements 16 can include a solder material or can be copper bumps. Further, the second conductive elements 16 can selectively include a UBM (Under Bump Metallurgy) layer 160.

Referring to FIG. 1E, a singulation process is performed along cutting paths S of FIG. 1D to obtain a plurality of silicon interposers 1a. Then, such a silicon interposer 1a is disposed on a packaging substrate 19 through the second conductive elements 16. The packaging substrate 19 has a plurality of conductive pads 190 electrically connected to the TSVs 101 through the second conductive elements 16. Further, an underfill 191 is formed between the silicon interposer 1a and the packaging substrate 19 to encapsulate the second conductive elements 16. The conductive pads 190 have a large pitch therebetween.

Referring to FIG. 1F, a plurality of electronic elements 17 such as chips are disposed on the first conductive elements 14 so as to be electrically connected to the circuit layer 12. In particular, the electronic element 17 is flip-chip bonded to the first conductive elements 14, and an underfill 171 is formed between the electronic elements 17 and the silicon interposer 1a to encapsulate the first conductive elements 14. The electronic elements 17 have a plurality of electrode pads having a small pitch therebetween.

Then, an encapsulant 18 is formed on the packaging substrate 19 to encapsulate the electronic elements 17 and the silicon interposer 1a.

Finally, a plurality of solder balls 192 are formed on a lower side of the packaging substrate 19 for mounting an electronic device, for example, a circuit board (not shown). As such, an electronic package 1 is obtained.

In the electronic package 1, the silicon interposer 1a serves as a signal transmission medium between the electronic elements 17 and the packaging substrate 19. To achieve a suitable silicon interposer 1a, the TSVs 101 must be controlled to have a certain depth to width ratio (100 um/10 um), thus consuming a large amount of time and chemical agent and incurring a high fabrication cost.

Further, during the CMP process, copper ions of the TSVs 101 can diffuse into the silicon substrate 10 and cause bridging or leakage problems between the TSVs 101.

Therefore, how to overcome the above-described drawbacks has become critical.

SUMMARY OF THE INVENTION

In view of the above-described drawbacks, the present invention provides a substrate structure, which comprises: a substrate body having opposite first and second surfaces; a plurality of conductive posts formed on the first surface of the substrate body and electrically connected to the substrate body; and a dielectric layer formed on the first surface of the substrate body for encapsulating the conductive posts, wherein one end surfaces of the conductive posts are exposed from the dielectric layer.

The present invention further provides an electronic package, which comprises: a substrate body having opposite first and second surfaces; a plurality of conductive posts formed on the first surface of the substrate body and electrically connected to the substrate body; a dielectric layer formed on the first surface of the substrate body for encapsulating the conductive posts, wherein one end surfaces of the conductive posts are exposed from the dielectric layer; at least an electronic element disposed on the second surface of the substrate body and electrically connected to the substrate body; and an encapsulant formed on the second surface of the substrate body for encapsulating the electronic element.

The present invention further provides a method for fabricating an electronic package, which comprises the steps of: forming a plurality of conductive posts in a carrier; forming a substrate body on the carrier, wherein the substrate body is electrically connected to the conductive posts; disposing at least an electronic element on the substrate body, wherein the electronic element is electrically connected to the substrate body; forming an encapsulant on the substrate body to encapsulate the electronic element; removing the carrier to cause the conductive posts to protrude from the substrate body; and forming a dielectric layer on the substrate body to encapsulate the conductive posts, wherein one end surfaces of the conductive posts are exposed form the dielectric layer.

In the above-described method, the carrier can be an insulating board, a metal board or a semiconductor substrate.

In the above-described method, removing the carrier can comprises: disposing a temporary carrier on the encapsulant; removing a portion of the carrier by grinding; and removing the remaining portion of the carrier by etching. After forming the dielectric layer, the method can further comprise removing the temporary carrier. The temporary carrier can be a glass carrier with an adhesive having a thickness of 10 um. Alternatively, the temporary carrier can be a tape having a thickness of 10 um.

In the above-described substrate structure, electronic package and fabrication method, the end surfaces of the conductive posts can be flush with a surface of the dielectric layer.

In the above-described substrate structure, electronic package and fabrication method, the conductive posts can have a length to width ratio of 1 to 5.

In the above-described substrate structure, electronic package and fabrication method, a plurality of conductive pads can be formed on the dielectric layer and electrically connected to the conductive posts. Further, a plurality of conductive elements can be formed on the conductive pads.

Therefore, the present invention reduces the length to width ratio of the conductive posts to meet the miniaturization requirement of end products, increase the product yield and reduce the fabrication cost.

Further, by replacing the conventional silicon substrate with the dielectric layer, the present invention eliminates the need to fabricate the conventional TSVs, thus greatly reducing the fabrication difficulty and cost.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2H are schematic cross-sectional views showing a method for fabricating an electronic package 2 according to the present invention.

Figure 1A:
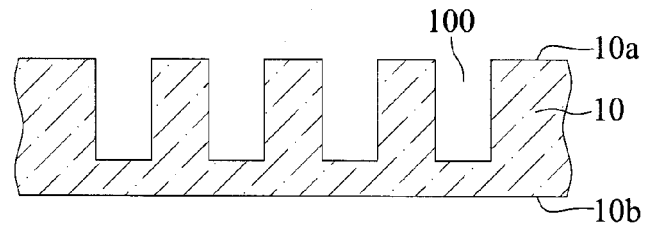
FIGS. 1A to 1F are schematic cross-sectional views showing a method for fabricating an electronic package according to the prior art, wherein FIG. 1C' is a partially enlarged view of FIG. 1C.
Figure 1B:
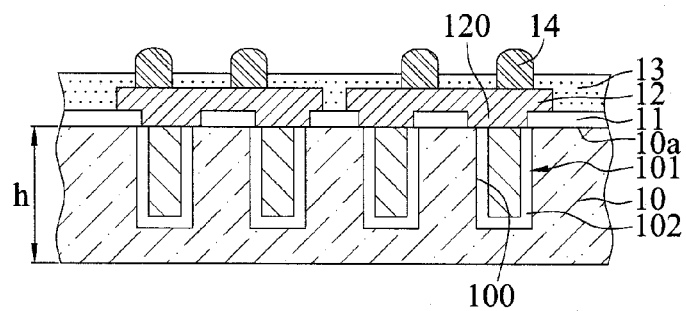
Figure 1C:
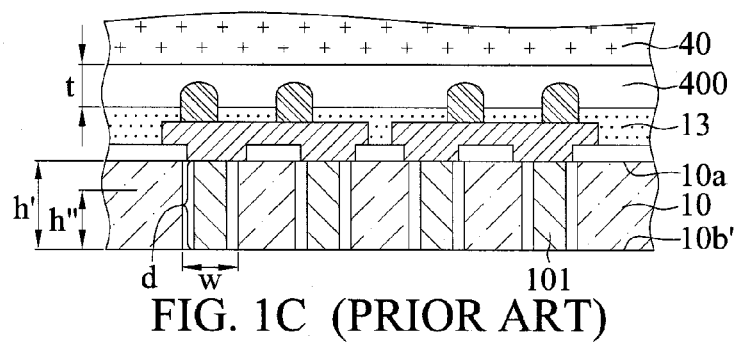
Figure 1C:
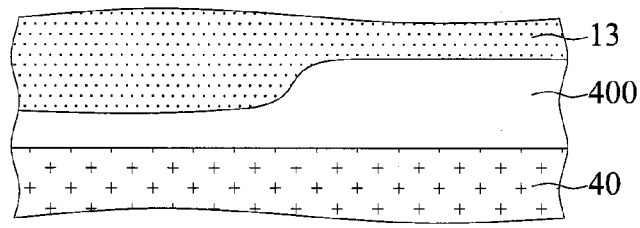
Figure 1D:
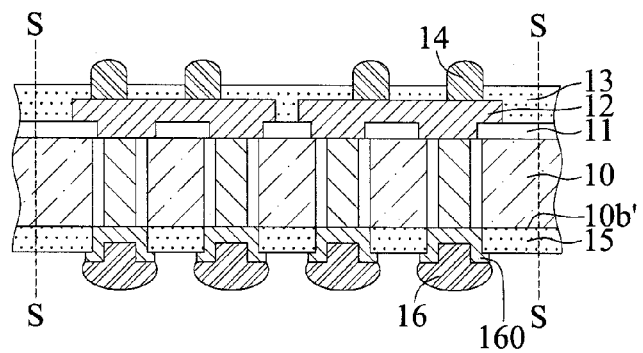
Figure 1E:
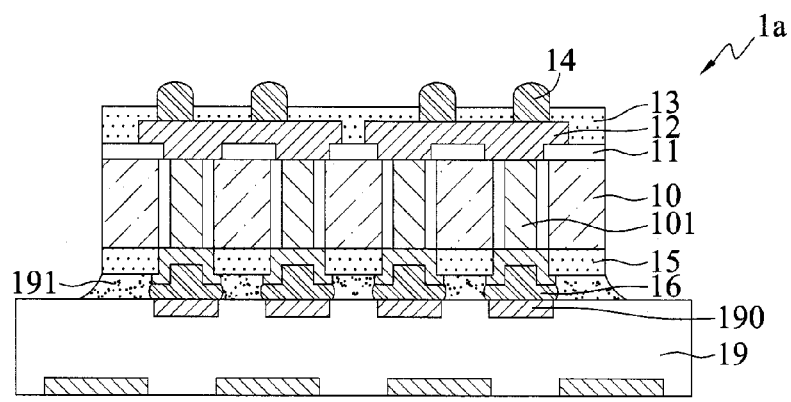
Figure 1F:
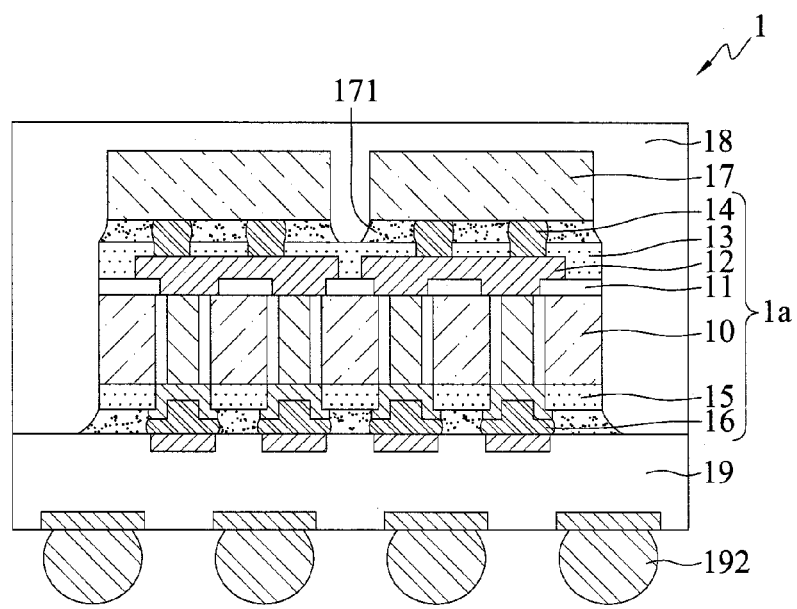
Figure 2A:
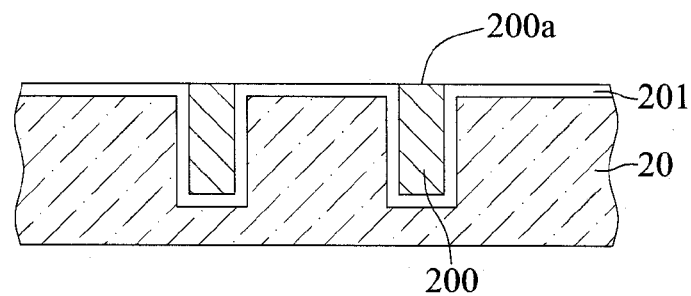
FIGS. 2A to 2H are schematic cross-sectional views showing a method for fabricating an electronic package according to the present invention, wherein FIG. 2G' shows another embodiment of FIG. 2G.

Referring to FIG. 2A, a carrier 20 is provided, which has a plurality of conductive posts 200 extending inward from one surface thereof.

In the present embodiment, the carrier 20 is an insulating board, a metal board, or a semiconductor substrate such as silicon or glass. The conductive posts 200 are metal posts, for example, copper posts.

In an example, the carrier 20 is a semiconductor substrate and the conductive posts 200 are fabricated through the following steps. First, a plurality of via holes are formed on a surface of the carrier 20. Then, an insulating layer 201 is formed on the carrier 20 and walls of the through holes. Subsequently, a conductive material such as a copper material is filled in the through holes to form the conductive posts 200. Thereafter, by performing a planarization process, upper end surfaces 200a of the conductive posts 200 are flush with a surface of the insulating layer 201. But it should be noted that fabrication of the conductive posts 200 is not limited to the above-described processes.

Figure 2B:
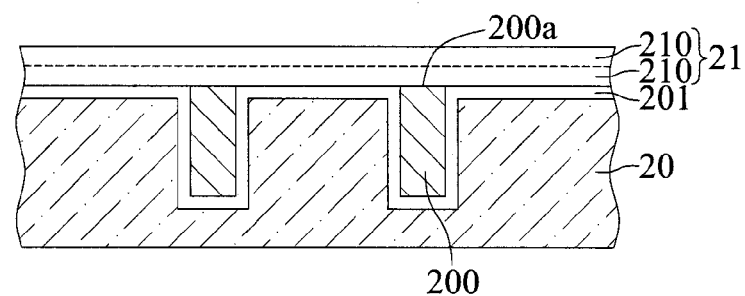

Referring to FIG. 2B, a first dielectric layer 21 is formed on the surface of the carrier 20.

In the present embodiment, the first dielectric layer 21 is bonded to the upper end surface surfaces 200a of the conductive posts 200 and the surface of the insulating layer 201.

Further, the first dielectric layer 21 includes two first sub-layers 210.

Figure 2C:
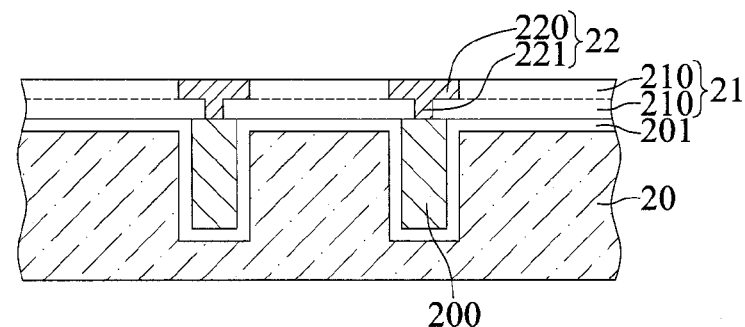

Referring to FIG. 2C, a first circuit layer 22 is formed in the first dielectric layer 21. The first circuit layer 22 has a plurality of first conductive pads 220 and a plurality of first conductive vias 221 electrically connecting the first conductive pads 220 and the conductive posts 200.

In the present embodiment, the first conductive pads 220 and the first conductive vias 221 are formed in the two different first sub-layers 210.

Further, a single one of the first conductive pads 220 is connected to a single one of the first conductive vias 221.

Figure 2D:
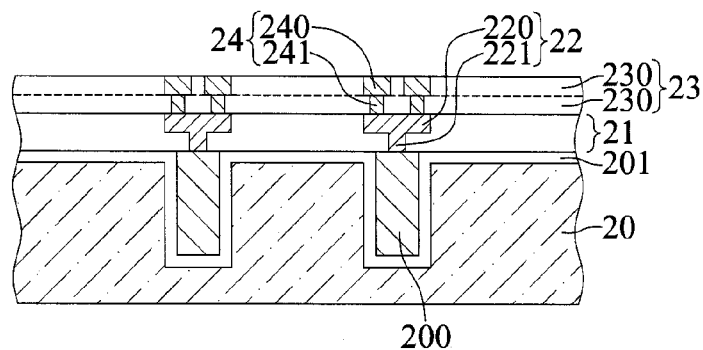

Referring to FIG. 2D, a second dielectric layer 23 is formed on the first dielectric layer 21, and a second circuit layer 24 is formed in the second dielectric layer 23. The second circuit layer 24 has a plurality of second conductive pads 240 and a plurality of second conductive vias 241 electrically connecting the second conductive pads 240 and the first circuit layer 22.

In the present embodiment, the second dielectric layer 23 includes two second sub-layers 230. The second conductive pads 240 and the second conductive vias 241 are formed in the two different second sub-layers 230.

Further, a single one of the second conductive pads 240 is connected to a single one of the second conductive vias 241, and a single one of the first conductive pads 220 is connected to two of the second conductive vias 241.

Figure 2E:
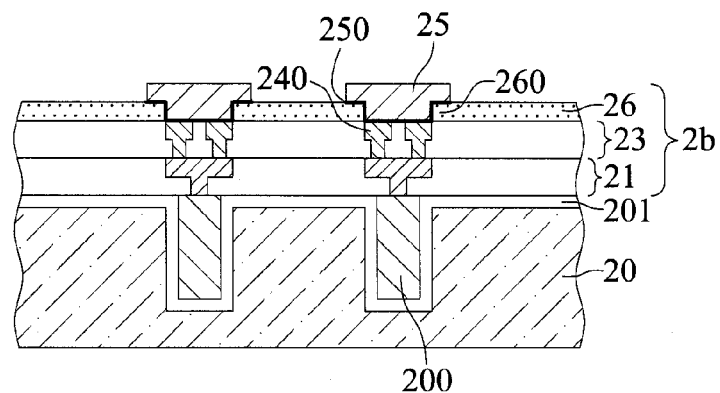

Referring to FIG. 2E, a plurality of first conductive elements 25 are formed on the second conductive pads 240.

In the present embodiment, an insulating layer 26 is first formed on the second dielectric layer 23 and exposing the second conductive pads 240, and then the first conductive elements 25 are formed on the second conductive pads 240.

The first conductive elements 25 can include a solder material or can be copper bumps. Further, the first conductive elements 25 can selectively include a UBM layer 250.

A single one of the first conductive elements 25 is connected to two of the second conductive pads 240. For example, a plurality of openings 260 are formed in the insulating layer 26. A single one of the openings 260 exposes two of the second conductive pads 240, and a first conductive element 25 is formed in the opening 260 and connected to the corresponding two of the second conductive pads 240.

The first dielectric layer 21, the first circuit layer 22, the second dielectric layer 23, the second circuit layer 24 and the first conductive elements 25 constitute a substrate body 2b. The insulating layer 26 can be selectively regarded as a portion of the substrate body 2b.

Figure 2F:
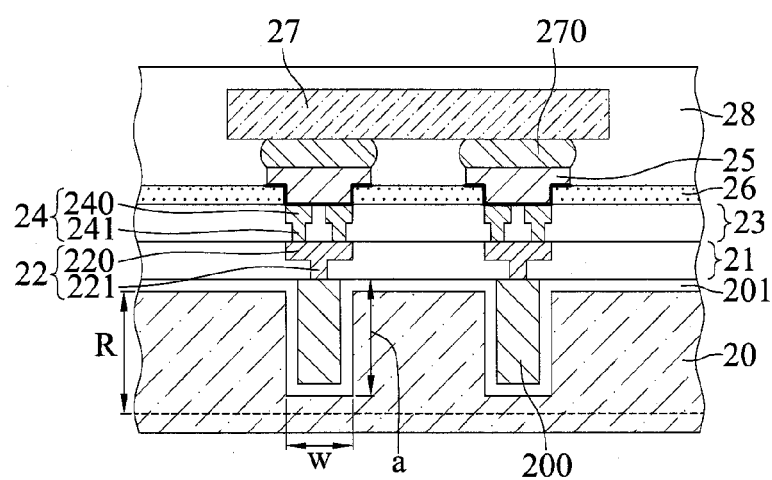

Referring to FIG. 2F, at least an electronic element 27 is disposed on the first conductive elements 25 so as to be electrically connected to the second circuit layer 24. Then, an encapsulant 28 is formed on the insulating layer 26 to encapsulate the electronic element 27.

In the present embodiment, the electronic element 27 is an active element such as a semiconductor chip, a passive element such as a resistor, a capacitor or an inductor, or a combination thereof.

The electronic element 27 is bonded to the first conductive elements 25 through a plurality of conductive bumps 270. A single one of the conductive bumps 270 is connected to a single one of the conductive elements 25.

The encapsulant 28 is made of a molding compound such as an epoxy resin, or a dielectric material.

Figure 2G:
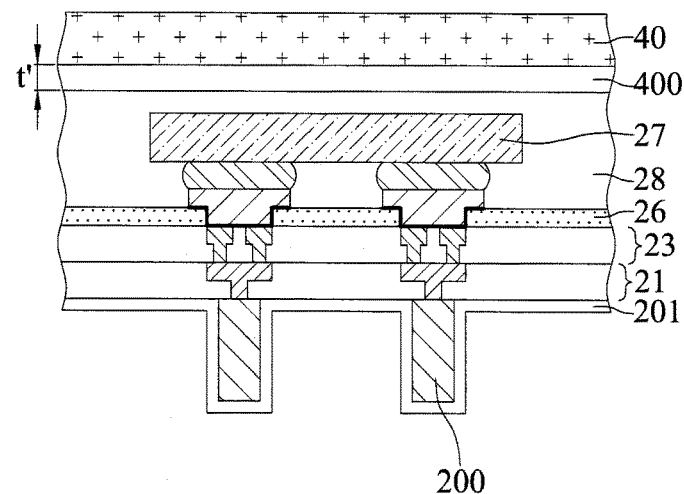
Figure 2G:
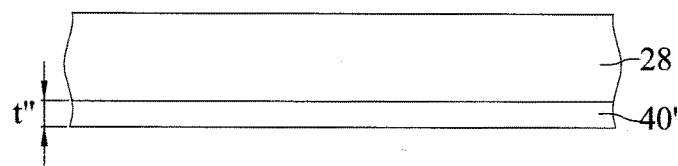

Referring to FIG. 2G, the carrier 20 is removed. As such, the insulating layer 201 is exposed and the conductive posts 200 protrude from the first dielectric layer 21.

In the present embodiment, referring to FIGS. 2G and 2G', a temporary carrier 40, 40' is disposed on the encapsulant 28 first and then a grinding process (mechanical grinding in combination with CMP) is performed to thin the carrier 20 to a thickness R of about 25 um (shown in FIG. 2F). Thereafter, a wet etching process is performed to remove the remaining portion of the carrier 20.

Referring to FIG. 2G, the temporary carrier 40 is a glass carrier having an adhesive 400. Alternatively, referring to FIG. 2G', the temporary carrier 40' is a backside grinding tape. The thickness t' of the adhesive 400 or the thickness t'' of the tape 40' is about 10 um, and the total thickness variation thereof is about 1 um.

The carrier 20 can be ground to have a thickness R below 25 um. As such, referring to FIG. 2F, the depth a of the conductive posts 200 can be 10 um and the depth to width ratio of the conductive posts 200 can be 2, i.e., 10 um/5 um (that is, the depth a of the conductive posts 200 is 10 um and the width w of the conductive posts 200 is 5 um).

Therefore, by coating a thin adhesive, the present invention improves the total thickness variation of the adhesive so as to prevent cracking of the carrier 20 during a grinding process. Further, since the total thickness variation is very small (about 1 um), the carrier 20 can be ground to have a thickness R below 25 um. Therefore, the subsequent wet etching process only needs to remove the carrier 20 having a thickness below 25 um, thus greatly shortening the etching time and reducing the cost of etching solution.

Further, the length to width ratio (i.e., the depth to width ratio) of the conductive posts 200 can be in a range of 1 to 5 according to the practical need.

Figure 2H:
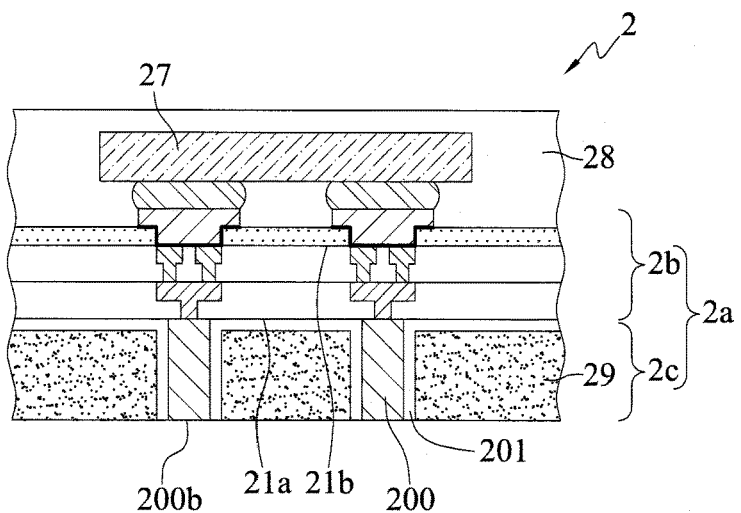

Referring to FIG. 2H, a third dielectric layer 29 is formed on the insulating layer 201 to encapsulate the conductive posts 200. Then, a planarization process is performed to expose lower end surfaces 200b of the conductive posts 200 from the third dielectric layer 29. The third dielectric layer 29 and the conductive posts 200 constitute an interposer 2c. The insulating layer 201 can be selectively regarded as a portion of the interposer 2c. Finally, the temporary carrier 40 is removed to obtain an electronic package 2 of the present invention.

In the present embodiment, the third dielectric layer 29 is made of polyimide, polybenzoxazole (PBO) or other photosensitive material.

Further, the planarization process involves removing the insulating layer 201 on the lower end surfaces 200b of the conductive posts 200 so as to cause the lower end surfaces 200b of the conductive posts 200 to be flush with surfaces of the third dielectric layer 29 and the insulating layer 201.

According to the present invention, the carrier 20 is completely removed and the third dielectric layer 29 is formed to encapsulate the conductive posts 200 and ground to expose one end surfaces of the conductive posts 200. Therefore, even if copper ions of the conductive posts 200 diffuse into the third dielectric layer 29, since the third dielectric layer 29 is an insulator, bridging or leakage will not occur between the conductive posts 200.

Figure 3:
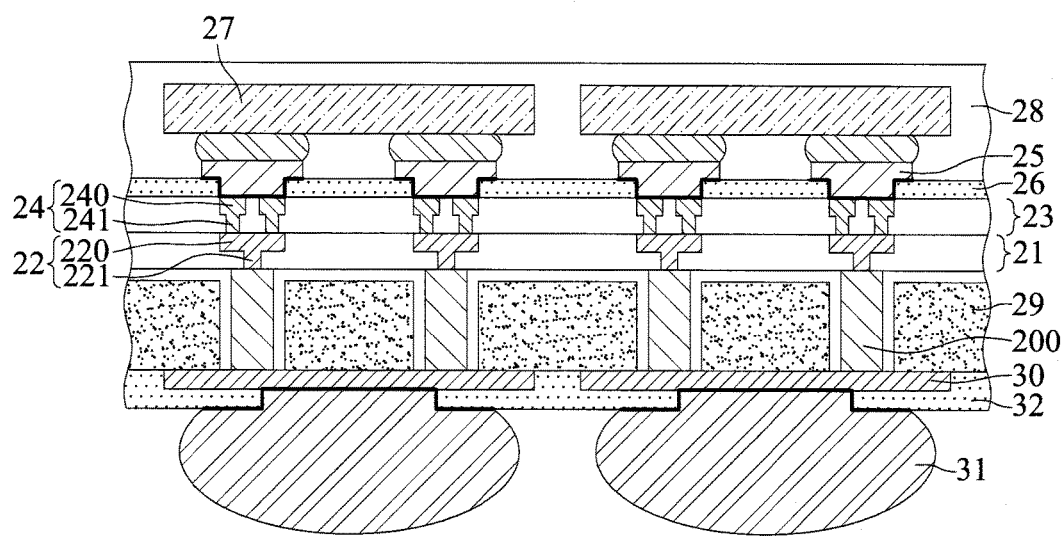
FIG. 3 is a schematic cross-sectional view of a process continued from FIG. 2H.

FIG. 3 is a schematic cross-sectional view of a process continued from FIG. 2H. Referring to FIG. 3, a plurality of conductive pads 30 are formed on the third dielectric layer 29 and electrically connected to the conductive posts 200. Then, a plurality of second conductive elements 31 such as solder balls are formed on the conductive pads 30 for mounting an electronic device, for example, a packaging substrate or a circuit board (not shown).

In the present embodiment, an insulating layer 32 is first formed on the third dielectric layer 29 and the conductive pads 30 and exposing portions of the conductive pads 30, and then the second conductive elements 31 are formed on the conductive pads 30.

Further, a single one of the conductive pads 30 is connected to two of the conductive posts 200, and the second conductive elements 31 are electrically connected to the conductive posts 200 through the conductive pads 30.

According to the present invention, the conductive posts 200 have a small depth to width ratio of 10 um/5 um, thereby meeting the miniaturization requirement of end products.

Further, the small depth a of the conductive posts 200 facilitates to shorten the time required for etching the via holes of FIG. 2A so as to increase the product yield and reduce the cost of chemical agent.

Furthermore, since the depth to width ratio of the conductive posts 200 is small, the present invention shortens the time required to remove the carrier 20 and reduces the consumption of chemical agent during removing of the carrier 20, thus reducing the fabrication cost.

In addition, by replacing the conventional silicon substrate with the third dielectric layer 29, the present invention eliminates the need to fabricate the conventional TSVs and hence greatly reduces the fabrication difficulty and cost.

The present invention further provides a substrate structure 2a, which has: a substrate body 2b having opposite first and second surfaces 21a, 21b; a plurality of conductive posts 200 formed on the first surface 21a of the substrate body 2b and electrically connected to the substrate body 2b; and a dielectric layer 29 formed on the first surface 21a of the substrate body 2b for encapsulating the conductive posts 200, wherein lower end surfaces 200b of the conductive posts 200 are exposed from the dielectric layer 29.

The conductive posts can have a length to width ratio of 1 to 5.

In an embodiment, the lower end surfaces 200b of the conductive posts 200 are flush with a surface of the dielectric layer 29.

In an embodiment, the substrate structure 2a further has a plurality of conductive pads 30 formed on the dielectric layer 39 and electrically connected to the conductive posts 200, and a plurality of conductive elements 31 formed on the conductive pads 30.

The present invention further provides an electronic package 2, which has: the above-described substrate structure 2a; at least an electronic element 27 disposed on the second surface 21b of the substrate body 2b and electrically connected to the substrate body 2b; and an encapsulant 28 formed on the second surface 21b of the substrate body 2b for encapsulating the electronic element 27.

Therefore, the present invention reduces the length to width ratio of the conductive posts so as to meet the miniaturization requirement of end products, increase the product yield and reduce the fabrication cost.

Further, by replacing the conventional silicon substrate with the dielectric layer, the present invention eliminates the need to fabricate the conventional TSVs, thus greatly reducing the fabrication difficulty and cost.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating an electronic package, comprising the steps of:
    forming an insulating layer on a carrier;
    forming a plurality of conductive posts in the carrier;
    forming a substrate body on the carrier, wherein the substrate body is electrically connected to the conductive posts;
    disposing at least an electronic element on the substrate body, wherein the electronic element is electrically connected to the substrate body;
    forming an encapsulant on the substrate body to encapsulate the electronic element;
    removing the carrier to cause the conductive posts to protrude from the substrate body; and
    forming a dielectric layer on the substrate body to encapsulate the conductive posts, wherein one end surfaces of the conductive posts are exposed from the dielectric layer, and wherein the insulating layer is formed on a first surface of the substrate body and between the dielectric layer and the conductive posts.

2. The method of claim 1, wherein the carrier is an insulating board, a metal board or a semiconductor substrate.

3. The method of claim 1, wherein the end surfaces of the conductive posts are flush with a surface of the dielectric layer.

4. The method of claim 1, wherein the conductive posts have a length to width ratio of 1 to 5.

5. The method of claim 1, wherein removing the carrier comprises:
    disposing a temporary carrier on the encapsulant;
    removing a portion of the carrier by grinding; and
    removing the remaining portion of the carrier by etching.

6. The method of claim 5, after forming the dielectric layer, further comprising removing the temporary carrier.

7. The method of claim 5, wherein the temporary carrier is a glass carrier with an adhesive having a thickness of 10 um.

8. The method of claim 5, wherein the temporary carrier is a tape having a thickness of 10 um.

9. The method of claim 1, further comprising forming a plurality of conductive pads on the dielectric layer, wherein the conductive pads are electrically connected to the conductive posts.

10. The method of claim 9, further comprising forming a plurality of conductive elements on the conductive pads.

* * * * *